United States Patent [19]
Alzmann et al.

[11] Patent Number: 4,481,533
[45] Date of Patent: Nov. 6, 1984

[54] METHOD AND APPARATUS FOR SUCCESSIVELY POSITIONING SHEETS OF MATERIAL WITH PRECISION FOR PUNCHING ALIGNING HOLES IN THE SHEETS ENABLING THE SHEETS TO BE USED IN THE MANUFACTURE OF COMPOSITE CIRCUIT BOARDS

[75] Inventors: Donald R. Alzmann; Michael Angelo, both of East Islip; Paul R. Waldner, Wantagh, all of N.Y.

[73] Assignee: Lenkeit Industries, Inc., Long Island City, N.Y.

[21] Appl. No.: 325,566

[22] Filed: Nov. 27, 1981

[51] Int. Cl.$^3$ .............................................. H04N 7/00
[52] U.S. Cl. ................................... 358/101; 358/107; 356/396; 356/401; 364/475
[58] Field of Search ................ 358/101, 107; 356/400, 356/401, 356, 397; 364/475, 489, 490, 491

[56] References Cited
U.S. PATENT DOCUMENTS 4,171,162 10/1979 Gerard ................................ 356/401
4,325,077 4/1982 Dunham ............................. 358/101

Primary Examiner—John C. Martin
Assistant Examiner—Edward L. Coles
Attorney, Agent, or Firm—Posnack, Roberts, Cohen & Spiecens

[57] ABSTRACT

Method and apparatus for effecting operations, such as punching holes in sheets of material at precise locations thereon. Each sheet has a reference marking thereon and is placed on a receiver one by one and is held in fixed position on the receiver. A T.V. camera views each sheet to detect the reference marking thereon and a visual display of the marking is produced on a T.V. monitor. Also produced on the monitor is a cross-hair grating with a coincident shaded box. The cross-hair grating is first aligned with a marking reference on a master sheet to establish a fixed relation between the cross-hair and the marking reference on the master sheet and thereby between the cross-hair and the operating system, for example, the punches for punching holes in the sheets. The master sheet is removed and the sheets to be punched are placed one by one on the receiver which is moved to align the reference marking on each sheet, as viewed on the monitor with the cross-hair grating thereon.

22 Claims, 14 Drawing Figures

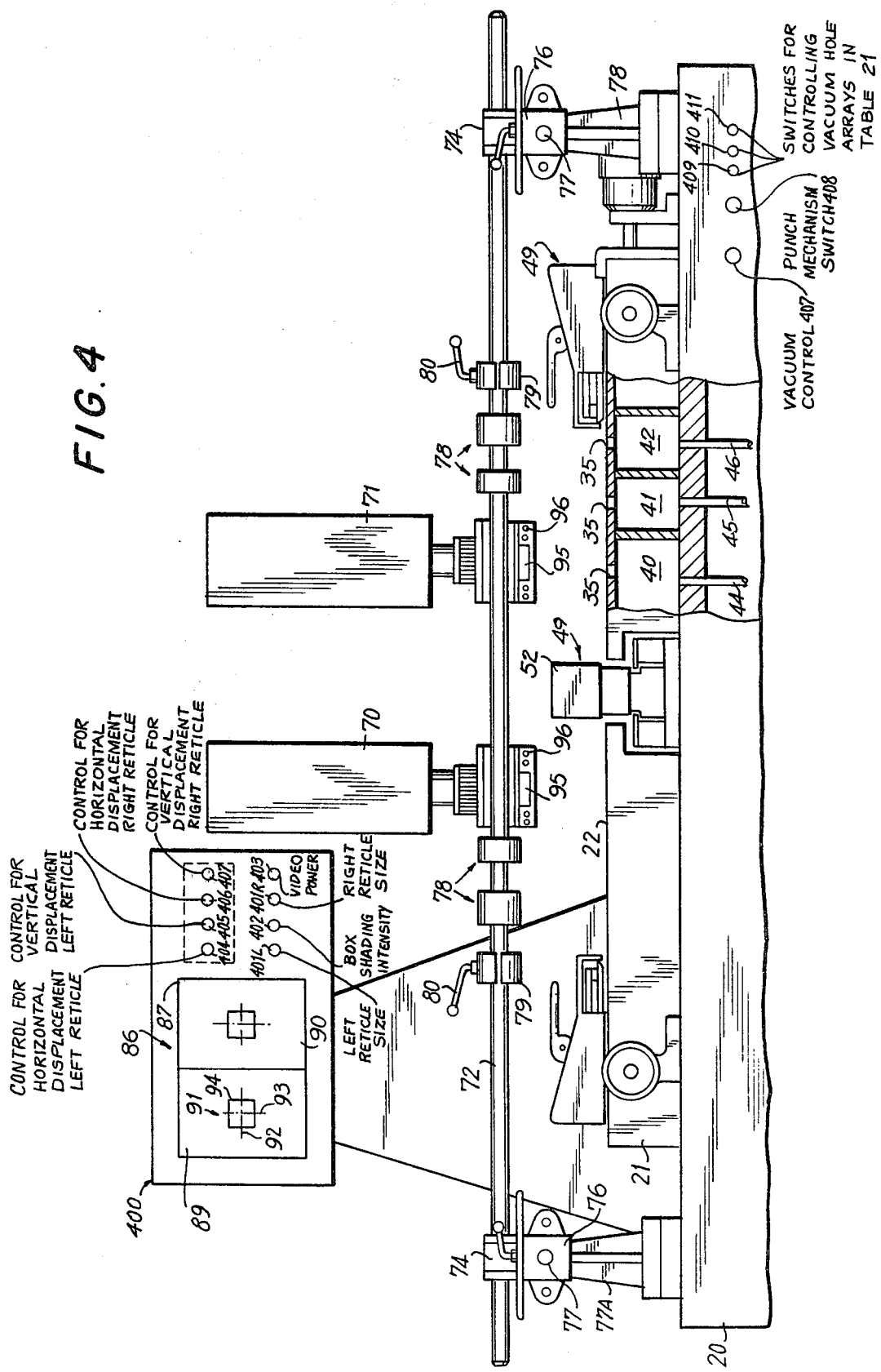

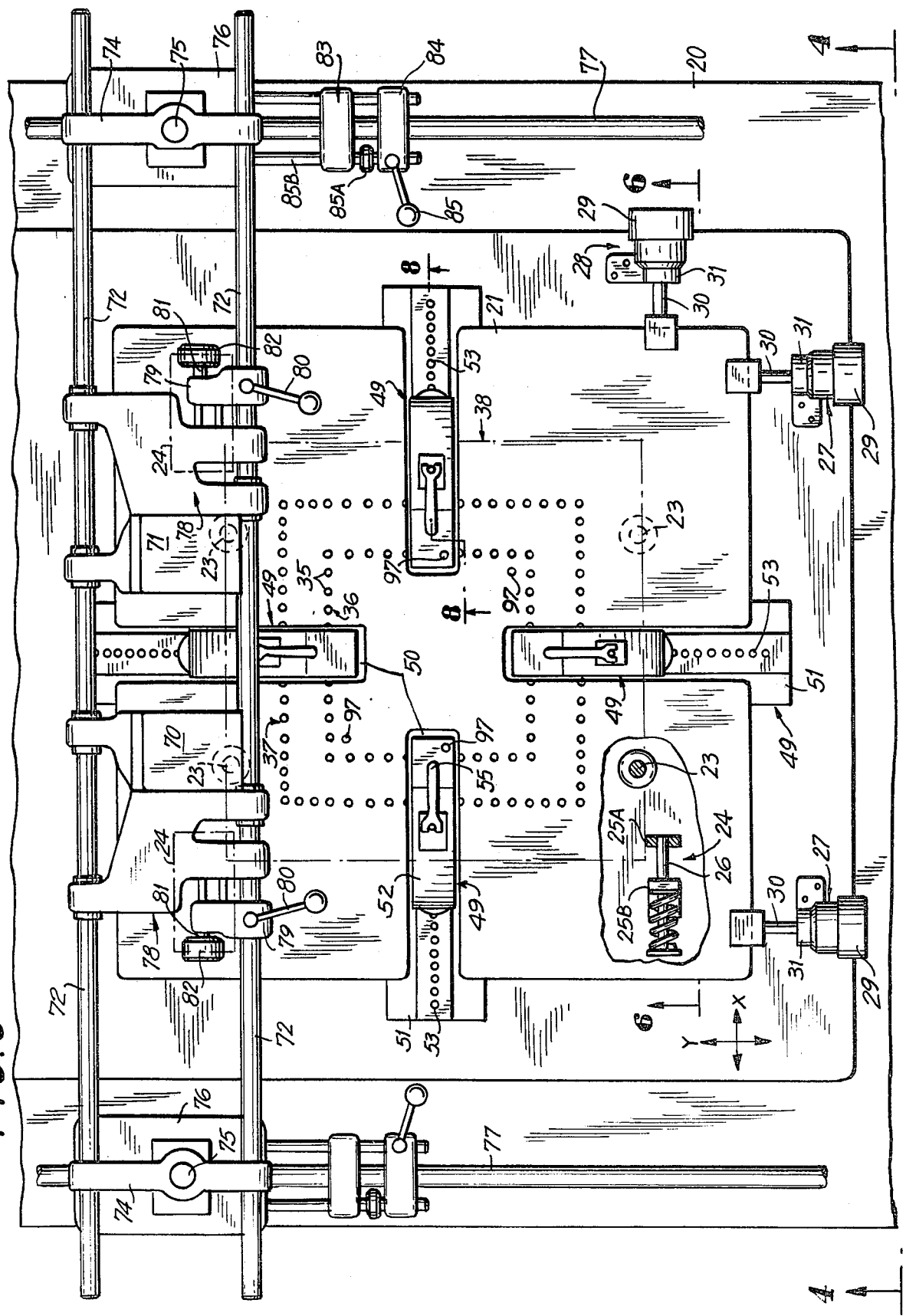

METHOD AND APPARATUS FOR SUCCESSIVELY POSITIONING SHEETS OF MATERIAL WITH PRECISION FOR PUNCHING ALIGNING HOLES IN THE SHEETS ENABLING THE SHEETS TO BE USED IN THE MANUFACTURE OF COMPOSITE CIRCUIT BOARDS

FIELD OF THE INVENTION

The invention relates to methods and apparatus for positioning sheets of material at precise locations particularly for carrying out operations on said sheets.

The invention is particularly adapted to the punching of alignment holes in artwork intended for use in the production of composite circuit boards.

PRIOR ART

In the production of multi-layer composite circuit boards, a number of laminate layers are joined together to form a composite board which defines a particular circuit or part thereof. In the joinder of the laminate layers to form the composite board, it is essential that the layers be properly aligned and that the circuit information on each layer be correctly superposed with respect to the circuit information on the other layers so that connections can be made at common junctures to form the circuit.

Each laminate layer is produced by exposing a laminate sheet or board having a dry film coating which is light sensitive through a film (referred to as in artwork layer) on which circuit information is placed. The film selectively exposes the dry film coating on the laminate sheet to leave an image of the circuit information thereon. By selective erosion of the exposed laminate sheet and/or metal deposition, the laminate layer is produced on which circuit information is contained. By joining a plurality of laminate layers, in aligned superposition, under high pressure and temperature a multi-layer printed circuit board is obtained.

The multi-layer board is drilled with a number of holes at circuit junctures where circuit connections are made.

One of the problems involved in producing the multi-layer printed circuit board is in the alignment of the laminate sheet and artwork for light exposure and in the alignment of the laminate layers in the formation of the circuit board. In order to produce an accurately located circuit portion on each of the laminate layers, it is necessary for the artwork and laminate sheet to be precisely aligned and in order for the circuits on the laminate layers to be aligned so that the holes will be at the circuit junctures the laminate layers must be aligned with respect to one another. A complicating factor is the dimensional instability of these elements, particularly the artwork which is relatively thin and composed of plastic material.

A known system for aligning laminate layers for multilayer lamination to produce printed circuit boards comprises forming four elongated slots in the laminate layers for registering the laminate layers on pins. Referring to FIG. 1 for an explanation of this system, therein is seen a laminate layer 1 formed with elongated slots 2,3,4,5. Slots 2 and 4 are located on an X axis and slots 3 and 5 are located on a Y axis. The slots are elongated along their respective axes. The slots are located in the layer 1 to receive respective pins P at the nominal centers thereof. The pins P are cylindrical with flatted edges fitting the longitudinal edges of the slots as shown. This arrangement permits expansion and contraction of laminate layer 1 about the center 0 at the intersection of the X and Y axes. Thereby, the center 0 is maintained as the geometric center of the layer 1 and despite expansion or contraction of the material of the layer, the centers of a multiplicity of layers stacked on pins P will be in precise coincidence. Consequently, all dimensional changes and tolerance errors in each layer 1 will be equally divided on opposite sides of the center of the layer along both axes. For example, an expansion of layer 1 in the X direction of 0.004" will be reflected by a 0.002" shift along the X axis at each pin in slots 2 and 4 while an expansion in the Y direction of 0.003" will be reflected by a 0.015" shift along the Y axis at each pin in slots 3 and 5.

One of the problems associated with the known system, however, is in the accurate placement of the circuit information on the laminate sheets and particularly in the placement of the artwork layers on each laminate sheet during light exposure so that when the laminate layers are stacked on pins P, the circuit information will be correctly aligned in respect of the holes to be drilled subsequently for the common connections.

SUMMARY OF THE INVENTION

An object of the invention is to provide for the formation of four slots in artwork layers at precise locations in respect of the circuit information thereon so that exposed laminate layers formed from said artwork can be superimposed on pins and formed into a circuit board in which the location of the common connections will be precisely superimposed.

A further object of the invention is to provide for precise placement of the four slots such that they define centers for said artwork layers which will be precisely coincident when their slots are placed on the same pins. By precise formation of the slots in the artwork layers in relation to the circuit information they will define centers which will be precisely coincident in the exposed laminate layers when the laminate layers are stacked and laminated together to form the multilayer printed circuit board.

Another object of the invention is to provide apparatus by which a layer of material such as an artwork layer can be formed with slots in accurate relation to slots formed in another artwork layer such that the centers of two exposed laminate layers formed from the artwork layers will be exactly coincident with one another when the laminate layers are superimposed on one another on the pins.

It is a feature of the invention that by so providing the slots, errors due to dimensional changes as a result of temperature variation, tolerances, and the like will be equalized in opposite directions from the center of each artwork layer.

Another object of the invention is to provide apparatus of the above type for aligning a layer in a position in which it is to be punched ulitizing optical means.

A further object of the invention is to provide a visual display by which the artwork layer can be shifted to a position in which its center will occupy an exact predetermined location.

Yet, another object of the invention is to provide an index positioning means in the visual display as a reference whereby the artwork layer can be moved to undergo shift with respect to the index positioning means to become aligned therewith.

In accordance with the invention in a general sense for effecting operations on sheets of material, particularly for punching slots in the material, each of the sheets is provided with a reference marking means thereon and the apparatus comprises a receiver for receiving the sheets one by one for holding the sheets in fixed position on the receiver. An operating means such as a punch serves for effecting an operation on the sheets at a precise location thereon. An optical means, such as a T.V. camera, views each sheet when in position on the receiver to detect the marking means thereon, and a visual display of the image of the marking means is produced on a display means such as a T.V. tube. The apparatus further comprises means for producing an index positioning means such as the crosshairs of a reticle on the display means and means for moving the index positioning means on the display means to establish a fixed relation between the index positioning means and the operating means. The receiver is adjustably movable to align the marking means on each sheet as viewed on the display means with the index positioning means thereon.

A further object of the invention is to provide a method by which an element, such as an artwork layer, can be positioned at a precise location, for example, to punch slots in the artwork layer.

Another object of the invention is to provide a method by which slots can be punched in the artwork layer such that the slots will define a center for the artwork layer in relation to reference marking means common to said artwork layer and to a reference sheet of material.

In further accordance with the invention, there is provided a method for positioning an element such as an artwork layer with a marking means thereon at a precise location to enable the artwork layer to be subjected to an operation such as punching slots therein. The method comprises holding a reference element such as a pre-punched laminate board with marking means thereon on a support, aiming a camera on the marking means on the reference element and displaying the image produced by the camera on a screen. The method further comprises producing a reticle on the screen and adjusting the position of the reticle on the screen to become aligned with the image of the marking means on the screen. The position of the camera and reticle is then locked and the reference element is removed from the support. Thereafter, the element to be precisely located on the support is placed thereon and the support is moved to align the marking means on the element as it appears on the screen with the reticle on the screen. Thereafter, a punching operation can be effected on the element to form slots which will be exactly aligned in relation to the marking means on the element.

BRIEF DESCRIPTION OF THE VIEWS OF THE DRAWING

FIG. 4 is an elevational view, partly broken away in section, of apparatus according to the invention for accurately punching slots in an artwork layer.

FIG. 5 is a plan view, partly broken away in section, of the apparatus in FIG. 4.

DETAILED DESCRIPTION

In manufacturing a printed circuit board, a plurality of laminate layers 10' are compressed under high pressure and temperature. Each laminate layer 10' includes circuit connection leads 11 formed by metal deposition or the like and the leads extend from pads or junctures 12 which are common to all of the laminate layers. After the multilayer circuit board is formed, holes are drilled therein at the common pads so that circuit connectors or the like can be attached to the circuit board to complete the electrical circuit.

As is conventional in the art, each laminate layer 10' is produced by exposing a sheet or laminate of plastic material of a thickness of 0.003 to 0.018" through a film or artwork layer 10 on which an image of the circuit pads and leads is placed. The laminate layer 10' has a light-sensitive dry film coating thereon so that the laminate layer 10' can be selectively exposed through the artwork layer 10 according to the circuit pattern on the artwork layer. After exposure, the light-sensitive film coating is washed away in the exposed or non-exposed areas depending on the composition of the dry film coating and metal deposition can be made to form the circuit connection leads and pads. The artwork layer 10 has a thickness of 0.003 to 0.018 and is made from a polyester film such as Mylar or the like. The artwork layer is subject to dimensional changes due to temperature and humidity variations. Nevertheless, it is extremely important that the circuit information of the artwork layer 10 be transferred to the laminate layer 10' in registry with slots in the laminate layer in order for the circuit connections and pads to be exactly located on the laminate layers so that when the laminate layers which form the multilayer circuit board are superimposed and pressed together, the circuit connections in the layers will all be accurately interconnected and the resulting circuit will be correctly formed. In order to achieve this, the slots formed in the artwork layer must be precisely located in relation to the circuit information on the artwork Thereby, accurate registry can be assured for the artwork and laminate layers during exposure and for accurate registry of the exposed laminate layers during joinder thereof under high pressure and temperature to form the multilayer printed circuit board.

Figure 1:
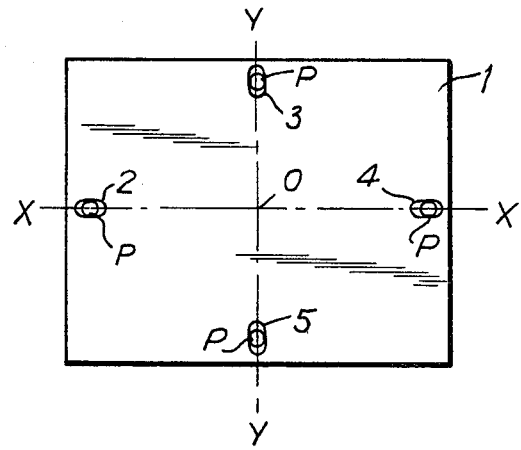
FIG. 1 diagrammatically shows a known system for accurate placement of a sheet in a registered position using four pins on a support engaging four slots in the sheet.
Figure 2:
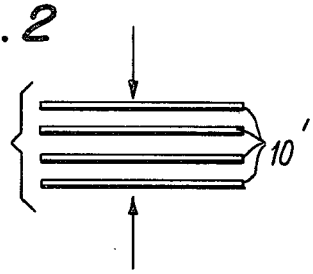
FIG. 2 diagrammatically illustrates the compression of laminate layers to form a printed circuit board.

The invention relies on the alignment system in which four elongated slots are punched in the artwork and laminate layers to achieve accurate registry on the manner illustrated in FIG. 1 and previously described with reference to the PRIOR ART.

In basic respect, the invention provides apparatus operating with an optical system for accurate positioning of artwork layers for punching four slots therein at registered locations such that the centers of the punched layers will be substantially referenced so that when laminate layers produced from the artwork layers are stacked on pins P, these centers will be coincident and any dimensional changes in the material of the artwork layers will be equalized from the centers thereof without buckling or skewing of the artwork layers on the pins.

Figure 6:
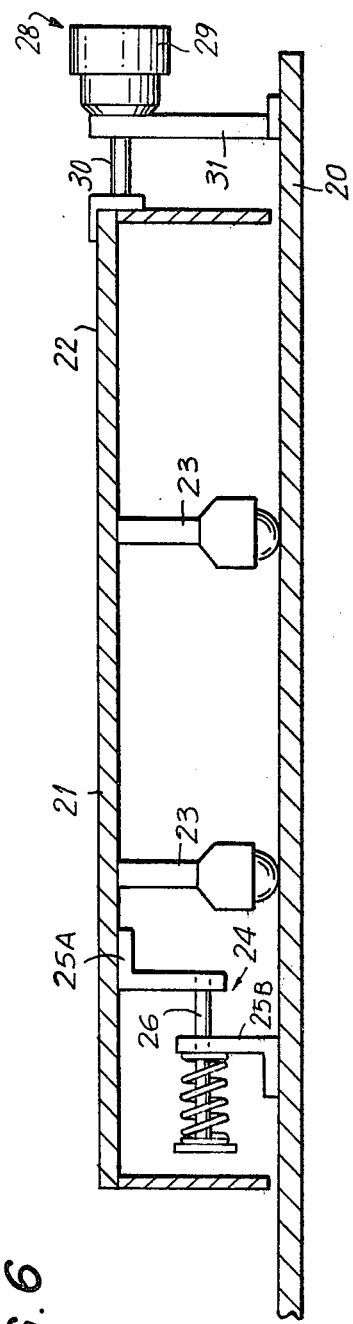
FIG. 6 is a sectional view taken on line 6—6 in FIG. 5.
Figure 8:
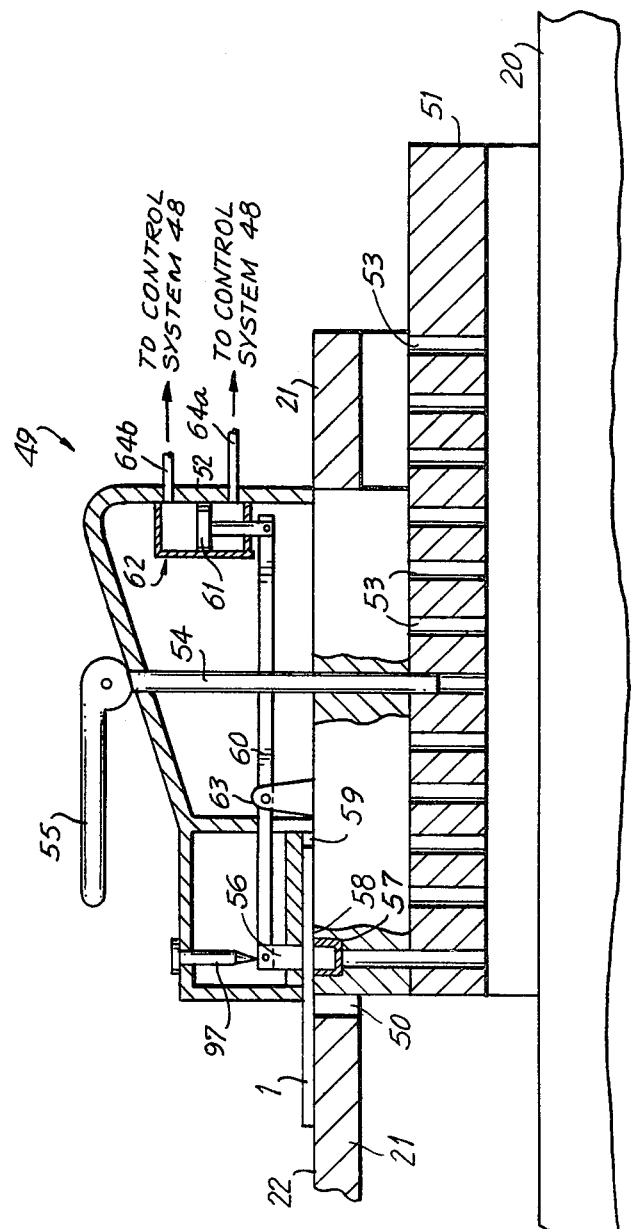
FIG. 8 is a sectional view taken on line 8—8 in FIG. 5
Figure 9:
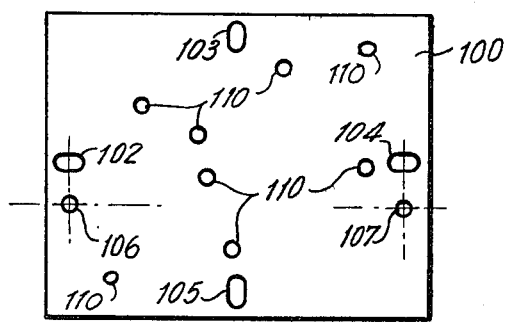
FIG. 9 is a diagrammatic illustration of a master sheet employed as a reference sheet in the apparatus of FIGS. 4–8 for setting the apparatus to punch slots in artwork layers.
Figure 11:
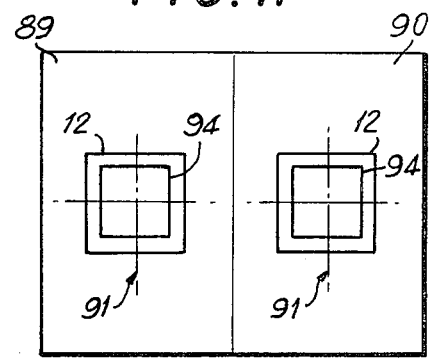
FIG. 11 is similar to FIG. 10 showing the image on the T.V. monitor for the artwork layer in a theoretically exact position.
Figure 10:
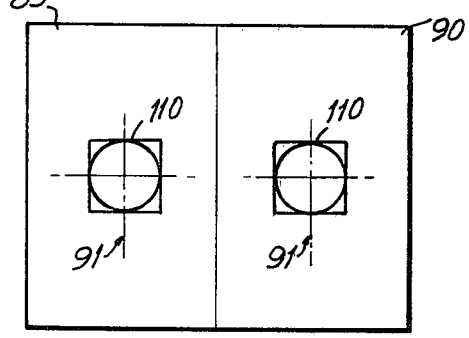
FIG. 10 diagrammatically illustrates a split screen image produced on a T.V. monitor in the apparatus of the invention for the reference sheet.

As seen in FIGS. 4–6 the apparatus comprises a fixed base or frame 20 on which is mounted a vacuum table 21 having an upper surface 22 on which a sheet of material such as an artwork layer can be placed. The vacuum table 21 is mounted on the base 20 by means of rollers 23 which permit slidable movement of the table 21 in its plane in all directions on frame 20. The table 21 is resiliently held in adjustable position on base 20 by elastic supports 24. Each support 24 comprises an angle member 25A fixed to table 21 and an angle member 25B fixed to base 20 and supporting an elastically biassed rod 26 which abuts against angle member 25A such that the table 21 can move in its plane to a limited extent against the elastic bias of rods 26. The supports 24 are three in number, two of which have their rods 26 extending in the Y direction while the third has its rod 26 extending in the X direction. In order to adjust the position of the table 21 relative to the base 20 in the X and Y directions, adjustment controls 27 and 28 are coupled between the base and table. Each adjustment control is in the form of a micrometer control and comprises a rotatable knob 29 which advances and retracts a rod 30. Each adjustment control is supported by a bracket 31 fixed to base 20. The rods 30 of adjustable controls 27 extend in the Y direction and are approximately aligned with rods 26 of associated supports 24 whereas the rod 30 of control 28 extends in approximate alignment with rod 26 of associated support 24. By turning knobs 29, the table 21 can be moved relative to the base in the X and Y directions whereby universal displacement of the table in its plane can be controlled. The magnitude of displacement of the table is relatively small and large displacements are not necessary as will become evident later.

The upper surface 22 of table 21 is provided with a plurality of vacuum holes 35 distributed therethroughout in successive rectangular arrays 36, 37, 38 of increasing size adapted for cooperating with sheets of material of different size placed thereon; within the table are manifolds 40, 41, 42 leading to the holes 35 of a respective array and the manifolds are connected by respective vacuum lines 44, 45, 46 to a control system 48 which regulates the connection of the vacuum lines to a vacuum source to control the connection of the vacuum holes in the different arrays to vacuum.

Mounted on the base 20 are four punch assemblies 49 for punching slots 2,3,4,5 (FIG. 1) in the sheet of material 1 placed on table 21. The punch assemblies are arranged in opposed pairs and are received in recesses 50 in table 21. The recesses 50 are larger than the punch assemblies 49 to allow the table 21 to undergo its maximum relative movement with respect to the base 20. Each punch assembly 49 comprises a support 51 fixed to the base 20 and a slide 52 which is axially movable on support 51. The support 51 is provided with a series of holes 53 which open at the top of the support. Mounted in slide 52 is a vertically slidable rod 54 which, when lowered into a respective hole 53, locks the position of the punch assembly 49 on support 51. Rod 54 can be raised and lowered by an engagement lever 55 which is pivotably connected to the slide 52 and provided with shoulders which embrace rod 54. When lever 55 is pivoted downwardy, pin 54 is lowered for engagement in a hole 53 whereas when lever 55 is pivoted upwardly, rod 54 is raised to a position above the holes 53. The slide 52 carries a punch 56 adapted to cooperate with a die 57 to punch an elongated slot 2,3,4, or 5 in the sheet of material 1 which is placed on table 21. Slide 52 has a work surface 58 which is coplanar with surface 22 of table 21 so that the sheet of material 1 can be placed on surfaces 22 and 58 and be received in a slot 59 in the punch assembly in order to be positioned between punch 56 and the die 57. The punch 56 is secured to a lever 60 which is pivotably connected at its opposite end to the piston 61 of a pneumatic cylinder 62. The lever 60 is pivotably supported at a bracket 63 at a location closer to the punch 56 in order to provide a mechanical advantage at the punch 56 to ensure clean punching of the sheet of material 1. The chambers of cylinder 62 are connected by respective lines 64a and 64b to control system 48 which controls the supply and discharge of pneumatic pressure medium to and from the chambers of the cylinder 62 to effect selective operation of the punch 56. The connection lines 64 and 64b from the four punch assemblies 49 are connected to control system 48 so that they are simultaneously operated.

Mounted above table 21 are two T.V. cameras 70,71 which face the upper surface 22 of table 21. The cameras 70 and 71 are slidable on two parallel guide bars 72 each of whose opposite ends are slidably received in a support 74 which is mounted on a vertical pivot 75 carried on a slide 76. The slide 76 is slidable on a guide bar 77 secured at its ends by brackets 77A at a level above table 21 and parallel thereto. The guide bars 72 and supports 74 form a parallelogram linkage which permits universal movement of the cameras 70,71 in a parallel plane above surface 22 of table 21 with the cameras being constrained to remain parallel to one another on bars 72. Each camera is mounted on guide bars 72 by a support mechanism 78. The support mechanism includes a clamp 79 which is selectively lockable with one of the bars 72 by a control lever 80. The clamp 79 threadably receives a threaded shaft 81 coupled to mechanism 78 and carrying a control knob 82 so that the mechanism 78 and the camera therewith can be adjustably moved along the bars 72.

Slides 76 each carries a locking mechanism 83 which is slidable on guide bar 77 and includes a clamp 84 which is lockable with bar 77 by a control lever 85. A control knob 85A rotatably coupled with clamp 84 is mounted on a threaded shaft 85B secured to slide 76 for adjustably moving the slide 76 on bar 77 after the locking mechanism 83 has been activated.

Mounted on base 20 is a T.V. receiver 86 having a T.V. monitor or tube 87. The cameras 70 and 71 are connected to the receiver 86 by an electronic circuit 88 to be described in detail later. The circuit 88 produces a split screen image on tube 87 consisting of left and right halves 89,90 on which are respectively displayed the images from cameras 70 and 71. The electronic circuit produces electronically, a reticle or cross-hair grating 91 consisting of horizontal and vertical cross-hairs 92,93 on each half of the split screen in horizontal alignment. The electronic circuit also produces a shaded square box 94 centered on the intersection of the cross-hairs 92,93. The shading and size of box 94 are adjustable. Surrounding the objective 95 of each camera 70 and 71 are illumination lamps 96 for illuminating the object placed on table 21. Two reference pins 97 are slidably mounted for vertical movement in the left and right punch mechanism 49 on the X axis for a purpose to be explained presently.

The T.V. cameras and receiver constitute an optical system for enabling accurate location of a sheet of material on the table 21 so that slots 2, 3, 4 and 5 can be punched thereon at precise locations.

Figure 3:
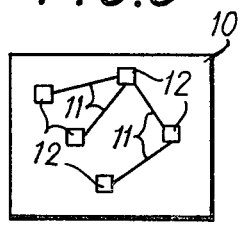
FIG. 3 diagrammatically illustrates an artwork layer to be used in the manufacture of a laminate layer.
Figure 7:
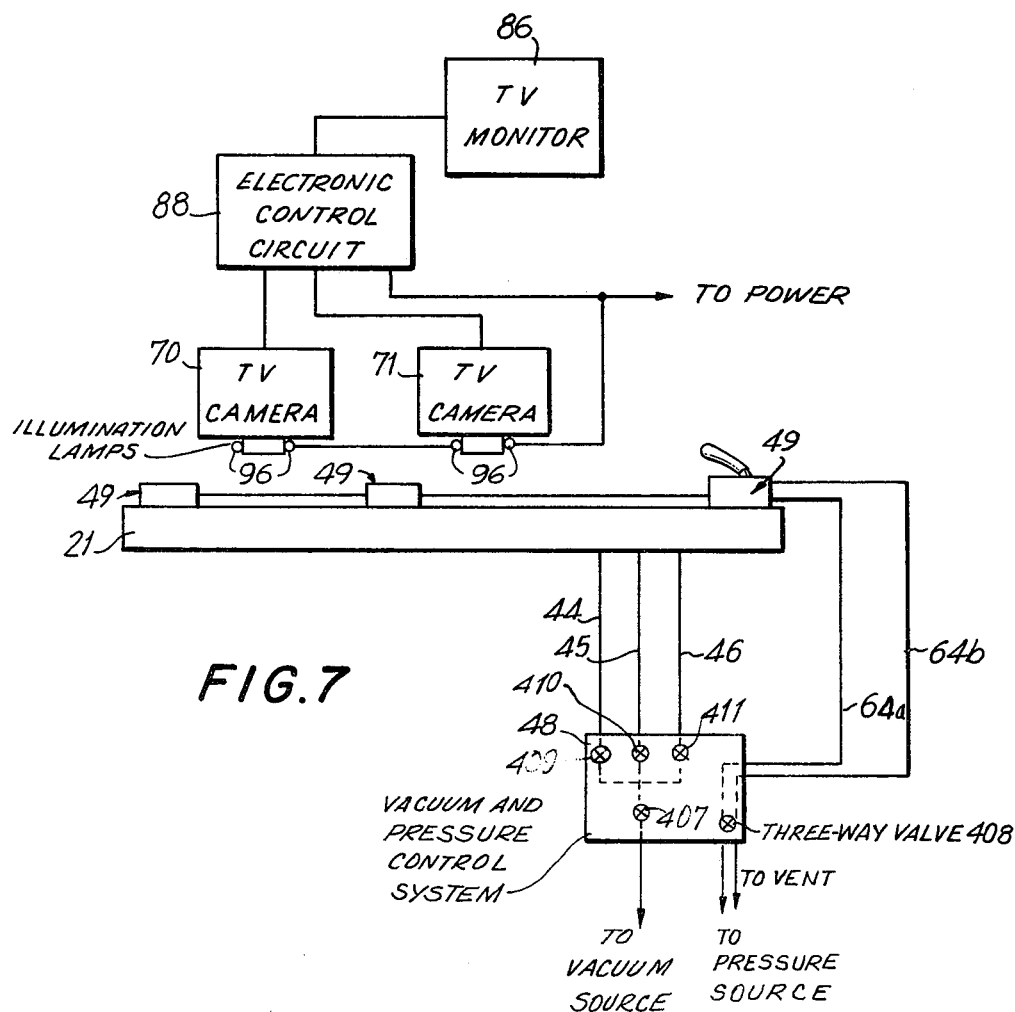
FIG. 7 is a diagrammatic illustration of a control circuit of the apparatus.

The apparatus will now be described in relation to the manner in which slots 2, 3, 4 and 5 are formed in sheets of material such as artwork layer 10 which includes circuit leads 11 and pads 12 thereon in the arrangement, for example, shown in FIG. 3. It is to be recalled that it is critical that the artwork layer be positioned so that the slots therein are punched in an exactly fixed location with respect to the circuit information on the layer. Thereby, when the artwork layer is superimposed on the laminate layer using the pin and slot system as shown in FIG. 1 and the laminate layer is exposed through the artwork layer, the image on the laminate layer will be in the same exact fixed relation with respect to the slots in the laminate layer as it was with respect to the slots in the artwork layer. Thereby, there will be exact superimposed coincidence of the circuit information on the stacked laminate layers when mounted on pins P during the compression of the layers to form the printed circuit.

A rigid reference sheet or master 100 is obtained by punching a thick sheet of rigid material such as aluminum of a thickness of between 0.032 and 0.062 to form four slots 102, 103, 104 and 105 and two pilot holes 106 and 107. The pilot holes 106 and 107 are respectively disposed on center lines extending in the Y direction through slots 102 and 104. The punching of the master can be achieved in a separate punching press from that of the invention. In this punching press, pilot holes 106, 107 are in fixed relation to the slots 102-105. The master 100 is then brought to a drilling station having four pins P which are fitted in the slots 102-105 so that the master sheet 100 will be precisely located. The master sheet 100 now in a defined position is drilled with holes 110 which are to be common to the pads 12 in each of the artwork layers. The master sheet 100 is then placed on the surface 22 of table 21 by introducing reference pins 97 on punch mechanisms 49 into the pilot holes 106,107. Punch mechanisms 49 are moved along slides 51 before the master 100 has been placed to the surface 22 such that the reference pins 97 in the punch mechanisms 49 will occupy positions corresponding to pilot holes 106 and 107 and such that the punch mechanisms will be positioned in correspondence with the punches which have produced the slots in the master 100. It is to be understood that the accuracy of location of the punch mechanisms on the base 20 and the punches in the separate punching press can be very accurately achieved since the supports 51 can be precision ground and the holes 53 located therein with close tolerance. The pins 54 carried by the slide 52 permit locking of the punch mechanisms 49 in accurate relation to one another and to the punches of the separate punching machine. The holes 53 can be designated for different size sheets according to the position of the slots to be formed in the sheets. The range, for example, can be for sheets from 9 inches by 9 inches to 24 inches by 24 inches over one-half inch increments. Punching accuracy is within plus or minus 0.001 inches with repeatability better than plus or minus 0.0005 inches. The problem to be solved by the invention is to ensure that the slots are punched in the artwork layers in precise relation to the circuit pattern or information on the artwork layers.

After the master sheet 100 has been placed on the surface 22 of table 21, the two cameras are moved on the parallelogram linkage so that each camera is precisely aligned above a respective selected drilled hole 110. Images of the selected holes will then be produced on the split screens 89 and 90. The locking mechanisms 83 for slides 76 are then locked and the locking mechanisms 79 for slides 78 are locked. Linear adjustments can be made utilizing the control knobs 82 and 85A. If further adjustment is necessary after the position of the cameras has been locked, the reticle 9 produced on the screens can be adjusted by means of the electronic circuit 88 in a manner to be explained in detail later. After the cross-hairs have been precisely located in correspondence with respect to the selected drilled holes, the master sheet is then removed. The cameras 70,71 now occupy a fixed relation with respect to the punching mechanisms 49 and remain so throughout the subsequent steps of the operation.

Figure 12:
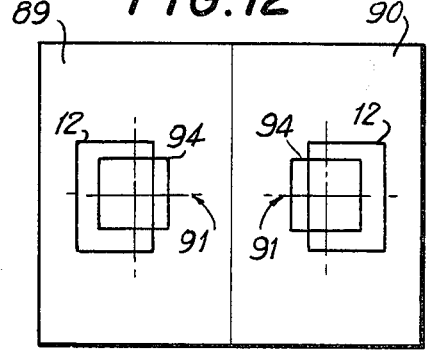
FIG. 12 shows the image in FIG. 10 for an artwork layer which has undergone expansion.

A first artwork layer which is to be employed in the production of a laminate layer of the printed circuit board is then placed on the surface 22 of table 21. The artwork layer will be moved on surface 22 until the pads 12 of the artwork layer corresponding to the selected drilled holes 110 in the master sheet will be in the field of view of the cameras as seen on the screens 89,90. The control system 48 is then operated to produce suction in the manifolds 40-42 according to the particular size of the artwork layer. The table 21 will then be adjusted by control knobs 29 until the cross-hairs on the reticles 91 on the split screens will be in precise registry with the selected pads 12 of the artwork. These pads 12 will now be in exact position corresponding to the drill holes 110 on the master sheet with which the cross-hairs were previously aligned and fixed. If there should be material shrinkage or expansion of the artwork layer, a shift of the table 21 can be effected to split the difference as shown in FIG. 12. The control system 48 is then operated to supply pressure fluid to the punching mechanisms 49 and the slots 2-5 are then simultaneously punched in the artwork layer. The punched artwork layer is now removed from the table after releasing the suction pressure, and the operation is repeated on all of the successive artwork layers which are to produce the laminate layers to make up the printed circuit board.

Figure 13:
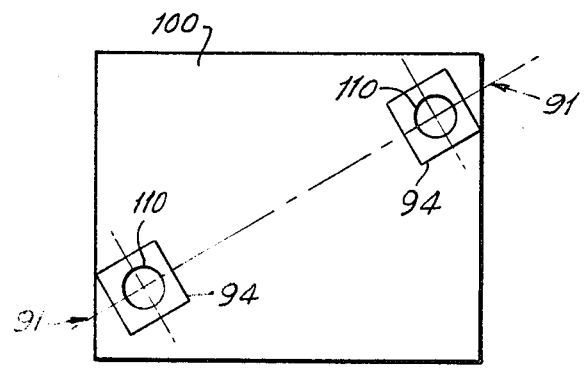
FIG. 13 diagrammatically illustrates the theoretical location of the images on the split screen in relation to the actual artwork layer.
Figure 14:
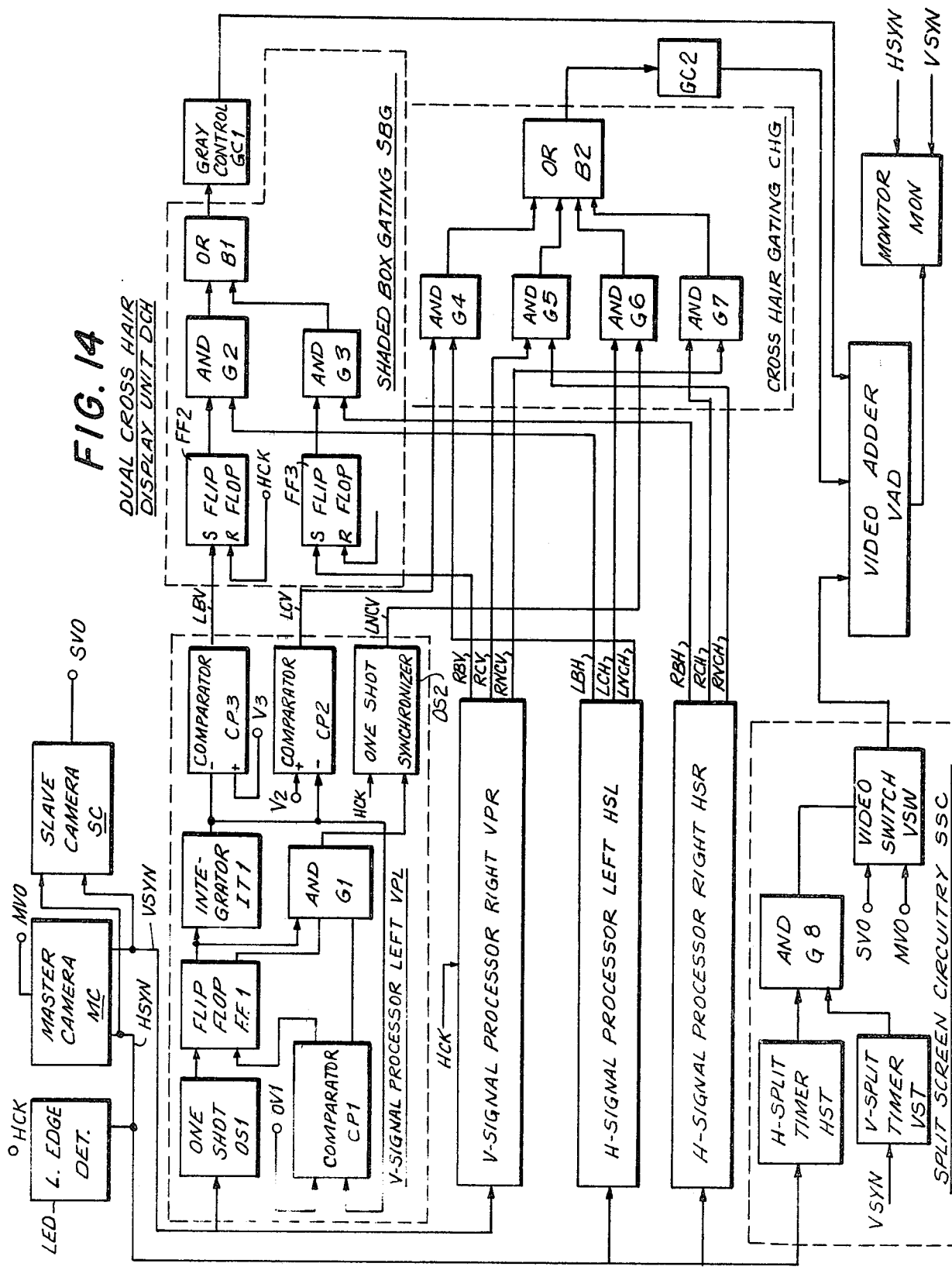
FIG. 14 is a circuit diagram of electronic equipment included in the apparatus of the invention.

It is to be appreciated that generally, the drilled holes which are selected for optical registry will be located on a line inclined at an angle with regard to the X and Y axes of the table 21 as exemplified by FIG. 13. Upon alignment of the cameras with the drilled holes, the cameras are constrained to lie along the line which connects the two drilled holes by virtue of their slidable support on the parallelogram linkage. The cross-hairs which are electronically produced on the screen always appear vertical and horizontal on the screen and therefore, will effectively be aligned with and perpendicular to the line joining the drilled holes. Viewing FIG. 13 the images produced on the split screen are effectively as shown on the actual layer. Thereby, when any differences between the reference image from the master sheet and the actual images from the particular artwork layer are split as shown in FIG. 12, this is effectively achieved along the line joining the selected pads.

In order to facilitate the image production on the split screens 89 and 90, the lamps 96 which encircle the objective 95 of the cameras can be energized. The objective 95 which is attached to the standard video camera, serves to enarge the image by a magnification of approximately eighteen times.

The construction of the electronic circuit 88 will now be described in detail.

The electronic circuit 85 and the T.V. cameras 70,71 and T.V. tube 87 constitute a dual cross-hair unit DCH in which T.V. camera 71 represents a master camera MC; T.V. camera 70 represents a slave camera SC, and T.V. tube 87 represents a monitor MON. The unit DCH comprises V-Signal processor left VPL; V-Signal processor right VPR; H-Signal processor left HSL; H-Signal processor right HSR; shaded box gating SBG; cross-hair gating CHG; gray control GC1; gray control GC2; split screen circuitry SSC, and video added VAD.

In operation, the Master Camera MC is the right-hand camera of the system as the viewer faces system and it supplies the synchronizing signals for the remainder of the unit. The Master Camera MC can be a type VC-1300A closed circuit television camera. This camera will supply at its outputs the horizontal and vertical sync signals on lines HSYN and VSYN, respectively. In addition, it will emit from its output a video signal on line MVO. The slave camera SC is the left hand camera and is synchronized by the receipt of the sync signals on lines HSYN and VSYN. The output of the slave camera SC is the video signal only SVO. Slave camera SC can be a type VC-1100A closed circuit television camera.

Each vertical sync signal on line VSYN is fed in parallel to the V-signal processor left VPL and the V-signal processor fight VPR where it is modified to generate signals for establishing the two shaded boxes 94 and the two cross-hair gratings 91 on the monitor. It should be noted that there are two shaded boxes 94 namely, a left box and a right box and within each shaded box is fixed a respective cross-hair grating.

These processor will in effect define the height of the shaded box as well as the height of the cross-hair associated with a box. The V-signal processor left VPL will define these dimensions for the left shaded box and the V-signal processor right VPR will define these dimensions for the right box. Since the processors are identical, only the V-signal processor left VPL will be described. Whenever a vertical sync signal on line VSYN is received by a one shot OSI, the one shot emits a pulse a given time after the receipt of the signal. The time delay is controllable so that the pulse in effect will occur at roughly any time between the top and bottom of the viewing screen of monitor MON. The position is controlled by a potentiometer (not shown.), which provides variable resistance for the timing network of the one shot. Thus, by rotating the potentiometer one can in effect move a shaded box up and down on the monitor's screen. The pulse from the one shot OS1 is fed to the set input of a flip flop FF1 whose output steeply rises from one level to another. The output of the flip flop FF1 is fed to the input of integrator IT1, which in response thereto starts generating a ramp voltage. This voltage is fed to one input of the comparator CP1 whose other input receives a given reference voltage. When the ramp voltage equals the reference voltage, the comparator CP1 emits a pulse to clear the flip flop FF1. When the flip flop FF1 is cleared, its output steeply drops again to its initial value and the integrator IT1 now generates a decreasing ramp voltage. The result is that the output of the integrator is a triangular waveform whose height is a function of the reference voltage fed to the second input of the comparator CP1 and whose duration is dependent on the time constant of the integrator. The sides of the waveform are symmetrical about its apex.

The output of the integrator IT1 is also fed to an input of the comparator CP3 whose other input receives a controllably variable voltage V3, which in a sense, selects the height, i.e., the vertical dimension of the shaded box. The comparator CP3 operates in the following manner: as long as the input signal is below a certain level, the output of the comparator is low. When the input signal reaches that level, the comparator switches on and stays on at a constant level until the input signal again falls below the certain level. Thus, the comparator CP3 changes the triangular waveform to a pulse, whose width is a function of the reference voltage fed to the comparator CP3. The output of the comparator CP3 is a pulse which effectively defines the beginning and the end of the vertical dimensions of the shaded box, i.e., the top and bottom of the box.

In a similar manner, the output of the integrator IT1 is fed to an input of the comparator CP2, which receives at its other input a reference voltage V3. This reference voltage is set at a lower level then that of the comparator CP3, since this comparator will generate a wider pulse associated with the height of the cross-hair. Finally, the processor VPL emits a very narrow pulse on line LNCV at the center of the shaded box. This narrow pulse is generated when the flip flop FF1 is cleared. The pulse is, however, synchronized with the leading edge of the horizontal sync signal as represented by the signal on the line HCK received at the second input of the AND circuit G1. (The leading edges of the horizontal sync signals are generated by the leading edge detector LED, which in effect is a digital differentiator.). Thus, in summary, the V-signal processor left VPL generates a pulse on the line LBV in response to each vertical sync signal received. This pulse defines the vertical dimension of the left shaded box. In addition, a wider pulse is generated on the line LCV to define the height of the left cross-hair and a pulse is generated on the line LNCV to establish in effect the horizontal line of the cross-hair. The V-signal processor right VPR performs the same functions for the right hand shaded box and includes the same components of the V-signal processor left VPL particularly including an independent variable ONE shot and an independently variable reference voltage equivalent to voltage V2.

The H-signal processor left HSL includes similar components as the V-signal processor left VPL except that now the AND gate G1 is deleted and the output of the equivalent flip flop FF1 is fed directly to the equivalent one shot OS2 which is unclocked. The H-signal processor right HSR is equivalent to the V-Signal processor right VPR except again for the deletion of said AND gate G1. The H-signal processors determine the width dimensions of the shaded box and the cross-hair with the H-signal processor left HS1 associated with the left cross-hair and the H-signal processor right being associated with the right cross-hair.

It is now necessary to combine the signals from the processors to obtain the actual displays. The shaded box gating SBG receives the signals on the one LBV and RBV and LBH and RBH to generate the video signals required for the display of the shaded boxes. The signal on the line LBV is synchronized with the H clock on line HCK in the flip flop FF2. Similarly, the signal of the line RBV is synchronized to such signal, by the flip flop FF3. In effect, the signals on the lines LBV and RBV, respectively, are clocked in and clocked out by the leading edge of the signal HCK, the so-called horizontal clock. This insures that the vertical gating is in synchronism with the horizontal sync. The horizontal and vertical signals for the left shaded box are received by the AND circuit G2. That is, the signal on the line LBH is fed directly to the AND circuit whereas the signal on the line LBV is fed via the flip flop FF2. In a similar way, the horizontal and vertical signals for the right shaded box are received by the AND circuit G3. The outputs of the AND circuits G2 and G3 respectively define the shaded boxes. These signals are then combined by OR circuit B1, which performs a simple OR or summing function so that both of the shaded boxes are now present. The shaded boxes are fed to gray control GC1, which is effectively an intensity control circuit which controls the brightness of the box. The output of the gray control circuit GC1 is fed to one input of the video adder VAD.

In an analogous manner, the cross-hair gating CGH establishes the video signal for the cross-hairs. This signal is derived from the signals on lines LCV, LNCV, RCV, RNCV, LCH, LNCH, RCH and RNCH, which are suitably gated by the AND circuits G4 to G7 in a conventional or straight forward manner. The outputs of the circuits G4 to G7 ar combined by OR circuit B2 and then fed to another gray control GC2, which controls the intensity of the cross-hair by controlling the amplitude of the video signal. The output of the gray control GC2 is fed to a second input of the video adder VAD.

Finally, the display unit includes split screen circuitry SSC which effectively displays the video signal from the master camera MC on the right hand side of the monitor MON and displays the video signal from the slave camera SC on the left hand side of the monitor MON. The split screen circuitry SSC also includes means for only displaying that part of the output of the video cameras which is purely video signals and does not possibly include any synchronizing signals. This is accomplished by effectively inhibiting the top and the left side of a display. Thus, when the H-split timer HSP receives the horizontal sync signal on unit HSYN it emits a pulse having a duration of approximately one-half of a horizontal sync period. This pulse is emitted after a delay sufficiently long to insure that the syncrhonizing signals have passed. Whenever a vertical sync pulse occurs, the signal on the line VSYN is fed to the V-split timer VST to emit a pulse which starts a time sufficiently long after the occurrence of the sync signal to insure that only video will be displayed. This pulse has a duration say equal to 90% of the vertical sync period. The signals from the H-split timer HST and the V-split timer VST are gated together in AND circuit G8 to provide a controlled signal fed to the control input of the video switch VSW. As long as a signal is present at the control input, the video switch VSW will pass the video signals on the line SVO to the video amilifier VAD. When the pulse is not present, the video switch VSW passes the video signal from the master camera MC via the line MVO to the video adder VAD. The video switch is a conventional switch which in effect is a single-pole double-throw switch which switches video from one source or the other. The output of the video adder VAD is then a composite of the video information from the master camera MC and the slave camera SC with the shaded boxes and the cross-hairs superimposed thereon. The monitor MON is a conventional monitor.

On a console 400 housing the T.V. monitor 86 there are provided controls for the reticles 91 and the shading boxes 94. Namely, as seen in FIG. 4, the controls include control 401L for adjusting the size of the recticle in the left screen, control 402 for adjusting the intentsity of shading of the shading boxes 94, and control 401R for adjusting the size of the reticle on the right screen. There is also provided controls for controlling the shading of the reticle. A power switch 403 for the video system is also disposed on the console. Located under an acess cover on the console for limited use are further controls including a control 404 for horizontal displacement of the left reticle on screen 89, a control 405 for vertical displacement of the left reticle on screen 89, a control 406 for horizontal displacement of the right reticle on screen 90 and a control 406 for vertical displacement of the right reticle on screen 90.

On the front of base 20 are a number of operating controls including a control 407 for activating the vacuum for table 21 and connecting the vacuum source to line 44, a control 408 comprising a three way valve selectively pressurizing the chambers of the cylinders of the punch mechanisms 49, and switches 409,410,411 for selectively connecting lines 44,45, 46 to the vacuum source for controlling the region of the table 21 to be subjected to vacuum.

While the invention has been described in connection with accurate punching of four slots in an artwork layer, it will become evident to those skilled in the art that the invention can be employed for other punching uses where registration of the punching in a series of sheets of material can be made in relation to a master sheet on the basis of common reference marking means on the sheets. Furthermore, while punching operations have been disclosed, other operations are equally possible such as marking or other material treatment.

Essentially, the table serves as a receiver means for receiving the sheets of material one by one and for holding the sheets in fixed position on the table and the T.V. cameras serve as optical means for viewing each sheet to detect the particular marking means thereon. The video tube serves as a display means for visually displaying the marking means on each sheet and the electronic circuit produces the cross-hairs which act as an index positioning means on the T.V. tube in order that the index positioning means occupies a fixed relation with the punch mechanisms or other suitable operating means. Thereby, when the receiver is adjustably moved to align the marking means on each sheet with the fixed index positioning means, it is assured that the sheet occupies an established relation with the operating means.

The invention is further characterized in that a reference element is employed to locate the optical means in a fixed position with respect to the reference element as measured by the correspondence between the index positioning means and the marking means on the reference element, whereafter, the position of the sheet to be precisely located on the receiver is adjusted by moving the receiver until the marking means on the sheet is aligned with the index positioning means on the screen.

What is claimed is:

1. Apparatus for effecting operations on sheets of material at precise locations thereon, each sheet having marking means thereon, said apparatus comprising receiver means for receiving sheets one by one and for holding said sheets in fixed position, operating means for effecting an operation on said sheets at precise locations thereon, optical means for viewing each sheet to detect the marking means thereon, display means for visually displaying the marking means on each sheet, means for producing an index positioning means on said display means, means for moving said index positioning means on said display means to establish a fixed relation between said index positioning means and said operating means, and means for adjustably moving said receiver means to align the marking means on each sheet, as viewed on the display means, with the index positioning means thereon, said optical means comprising a video camera and said display means comprising a video tube, said index positioning means comprising a reticle and said means for producing the index positioning means comprises electronic means for electronically producing said reticle on said video tube.

2. Apparatus as claimed in claim 1 wherein said electronic means includes means for moving said reticle on the video tube on the face thereof.

3. Apparatus as claimed in claim 2 wherein each sheet has two marking means thereon, said apparatus comprising a second video camera, each camera viewing a respective one of said marking means on the sheet, said video tube having split images thereon respectively of the marking means viewed by each camera, each split image having a respective reticle thereon for association with the respective marking means, each reticle being separately movable in its own field for alignment with the respective marking means.

4. Apparatus as claimed in claim 3 comprising means supporting said video cameras for movement in a plane above said receiver means parallel thereto.

5. Apparatus as claimed in claim 4 wherein the means supporting the video cameras comprises a frame supporting said cameras for slidable movement along a common longitudinal axis in said plane above the receiver means and means supporting said frame on said receiver means for slidable movement in mutually perpendicular directions in said plane above the receiver means.

6. Apparatus as claimed in claim 5 comprising first locking means for locking said cameras on said frame along said longitudinal axis, and second locking means for locking said frame with respect to said receiver means.

7. Apparatus as claimed in claim 2 wherein said means for producing said index positioning means further comprises means for producing a square in superposition on said reticle, the center of the square being coincident with the origin of the reticle.

8. Apparatus as claimed in claim 7 wherein said means for producing said index positioning means further comprises means for providing a varying shading in said square.

9. Apparatus as claimed in claim 7 wherein said means for producing said index positioning means further comprises means for varying the size of said square.

10. Apparatus as claimed in claim 7 wherein said marking means comprises a hole in said sheet, said square being of a size to surround said hole with the square coincident therewith.

11. Apparatus for effecting operations on sheets of material at precise locations thereon, each sheet having marking means thereon, said apparatus comprising receiver means for receiving sheets one by one and for holding said sheets in fixed position, operating means for effecting an operation on said sheets at precise locations thereon, optical means for viewing each sheet to detect the marking means thereon, display means for visually displaying the marking means on each sheet, means for producing an index positioning means on said display means, means for moving said index positioning means on said display means to establish a fixed relation between said index positioning means and said operating means, and means for adjustably moving said receiver means to align the marking means on each sheet, as viewed on the display means, with the index positioning means thereon, said operating means comprising means for forming holes in said sheets of materials.

12. Apparatus as claimed in claim 11 wherein said receiver means comprises a table which is movable in a plane.

13. Apparatus as claimed in claim 12 comprising means for clamping said sheets one by one to said table.

14. Apparatus as claimed in claim 13 wherein the clamping means comprises a vacuum means.

15. Apparatus as claimed in claim 11 wherein said hole forming means is operatively positioned relative to the receiver means and includes means for adjustably receiving said sheets to enable the sheets to be moved with the receiver means for aligning the marking means on the sheets with the index positioning means on the display means.

16. Apparatus as claimed in claim 15 wherein said hole forming means comprises means for mechanically producing holes in said sheets.

17. Apparatus as claimed in claim 15 wherein said means for forming holes comprises a punch and an opposed die secured in adjustable position relative to said receiver means and positioned to receive said sheets one by one between the punch and die when the sheets are precisely located on said receiver means.

18. Apparatus as claimed in claim 17 wherein a plurality of punches and respective opposed dies are positioned at different locations with respect to said receiver means, said operating means further comprising means for operating the punches simultaneously.

19. A method of positioning an element with a marking means thereon at a precise location, said method comprising holding a reference element with marking means thereon on a support, aiming a camera at said marking means on the reference element, displaying the image produced by the camera on a screen, producing a reticle on said screen, adjusting the position of the reticle on said screen to align with the image of said marking means on said screen, locking the position of said camera and said reticle, removing the reference element, placing the element to be precisely located onto said support and moving said support to align the marking means on said element as it appears on said screen with the reticle on said screen and forming holes in the precisely located element after it has been positioned on said support.

20. A method as claimed in claim 19 wherein the holes are formed by a mechanical punching operation.

21. A method as claimed in claim 19 wherein the reticle is produced on the screen electronically and the adjustment of the position of the reticle on the screen is also effected electronically.

22. A method as claimed in claim 19 wherein the holes which are formed in the sheet are respective pairs of elongated holes aligned along respective X and Y axes.

* * * * *